United States Patent
Elwany

(10) Patent No.: US 9,615,487 B2
(45) Date of Patent: Apr. 4, 2017

(54) COMPUTER STORAGE ARRAY

(71) Applicant: M&A Technology, Inc., Carrolton, TX (US)

(72) Inventor: Magdy Elwany, Dallas, TX (US)

(73) Assignee: M&A Technology, Inc., Carrollton, TX (US)

( * ) Notice: Subject to any disclaimer, the term of this patent is extended or adjusted under 35 U.S.C. 154(b) by 0 days.

(21) Appl. No.: 15/016,251

(22) Filed: Feb. 4, 2016

(65) Prior Publication Data

US 2017/0034954 A1 Feb. 2, 2017

Related U.S. Application Data

(63) Continuation of application No. 14/256,922, filed on Apr. 19, 2014, now abandoned, which is a continuation of application No. 14/040,327, filed on Sep. 27, 2013, now Pat. No. 8,720,701, which is a continuation of application No. 13/593,509, filed on Aug. 24, 2012, now Pat. No. 8,561,814, which is a continuation of application No. 12/770,934, filed on Apr. 30, 2010, now abandoned.

(51) Int. Cl.
*H05K 7/20* (2006.01)
*G06F 1/20* (2006.01)

(52) U.S. Cl.
CPC .......... *H05K 7/20736* (2013.01); *G06F 1/20* (2013.01); *H05K 7/20727* (2013.01)

(58) Field of Classification Search
CPC .. H05K 7/20736; H05K 7/18; H05K 7/20727; H05K 7/1487; H05K 7/1488; G06F 1/20
USPC ................. 211/26, 189, 103, 187; 361/679.46–679.54, 724–727, 688–689, 361/694–695, 715; 312/223.1, 223.2, 312/213, 236; 454/184
See application file for complete search history.

(56) References Cited

U.S. PATENT DOCUMENTS

| | | | | |
|---|---|---|---|---|
| 5,400,215 A * | 3/1995 | Chung | ............... | B60R 11/0211 312/334.39 |
| 6,418,011 B2 * | 7/2002 | Omori | ................. | G11B 33/124 248/65 |
| 6,616,251 B2 * | 9/2003 | Searby | .................... | G06F 1/181 312/223.2 |
| 6,654,241 B2 * | 11/2003 | Hillyard | ................... | G06F 1/16 312/223.1 |
| 6,927,976 B1 * | 8/2005 | Malone | ............. | H05K 7/20727 361/679.46 |
| 7,085,131 B2 * | 8/2006 | Peng | ....................... | G06F 1/187 312/223.1 |
| 7,236,370 B2 * | 6/2007 | Coglitore | ............ | H05K 7/1411 235/375 |
| 7,286,345 B2 * | 10/2007 | Casebolt | ........... | H05K 7/20736 361/679.48 |
| 7,315,456 B2 * | 1/2008 | Mondor | ............... | G06F 13/409 361/788 |
| 2003/0128512 A1 * | 7/2003 | Owens | .................. | G02B 6/293 361/689 |

(Continued)

*Primary Examiner* — Daniel J Troy
*Assistant Examiner* — Hiwot Tefera
(74) *Attorney, Agent, or Firm* — Bill R. Naifeh

(57) ABSTRACT

A computer storage array and ventilation system comprising a vertical air passageway adjacent to a plurality of ventilation apertures defined in a plurality of computer chassis.

4 Claims, 4 Drawing Sheets

(56) References Cited

U.S. PATENT DOCUMENTS

| | | | | |
|---|---|---|---|---|
| 2004/0070936 | A1* | 4/2004 | Coglitore | G06F 1/18 361/679.5 |
| 2005/0265004 | A1* | 12/2005 | Coglitore | H05K 7/1488 361/724 |
| 2005/0270751 | A1* | 12/2005 | Coglitore | H05K 7/1411 361/724 |
| 2007/0247036 | A1* | 10/2007 | Fuh | G06F 1/187 312/223.2 |
| 2008/0047961 | A1* | 2/2008 | Liang | G06F 1/20 220/222 |
| 2008/0049393 | A1* | 2/2008 | Coglitore | G06F 1/18 361/679.45 |

* cited by examiner

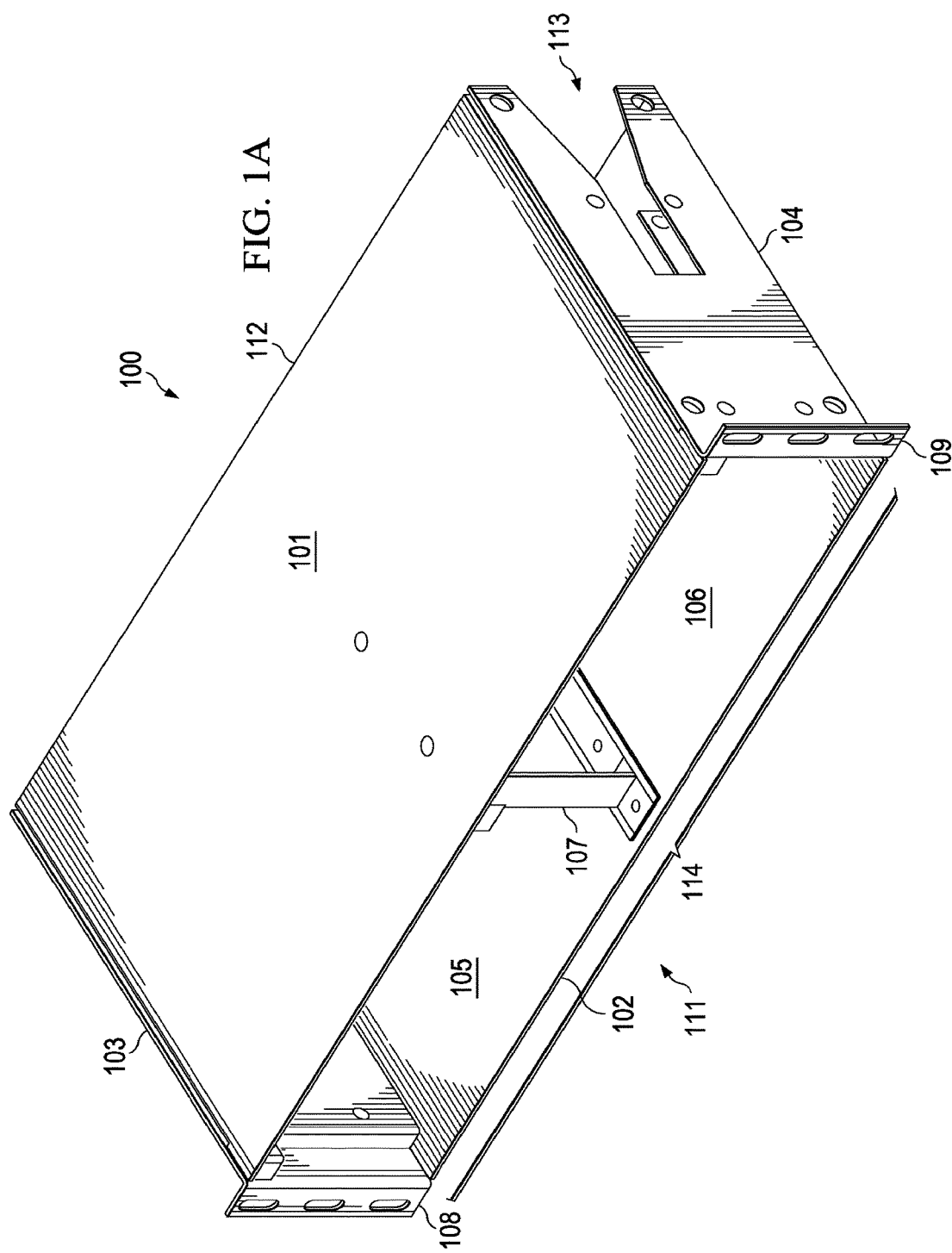

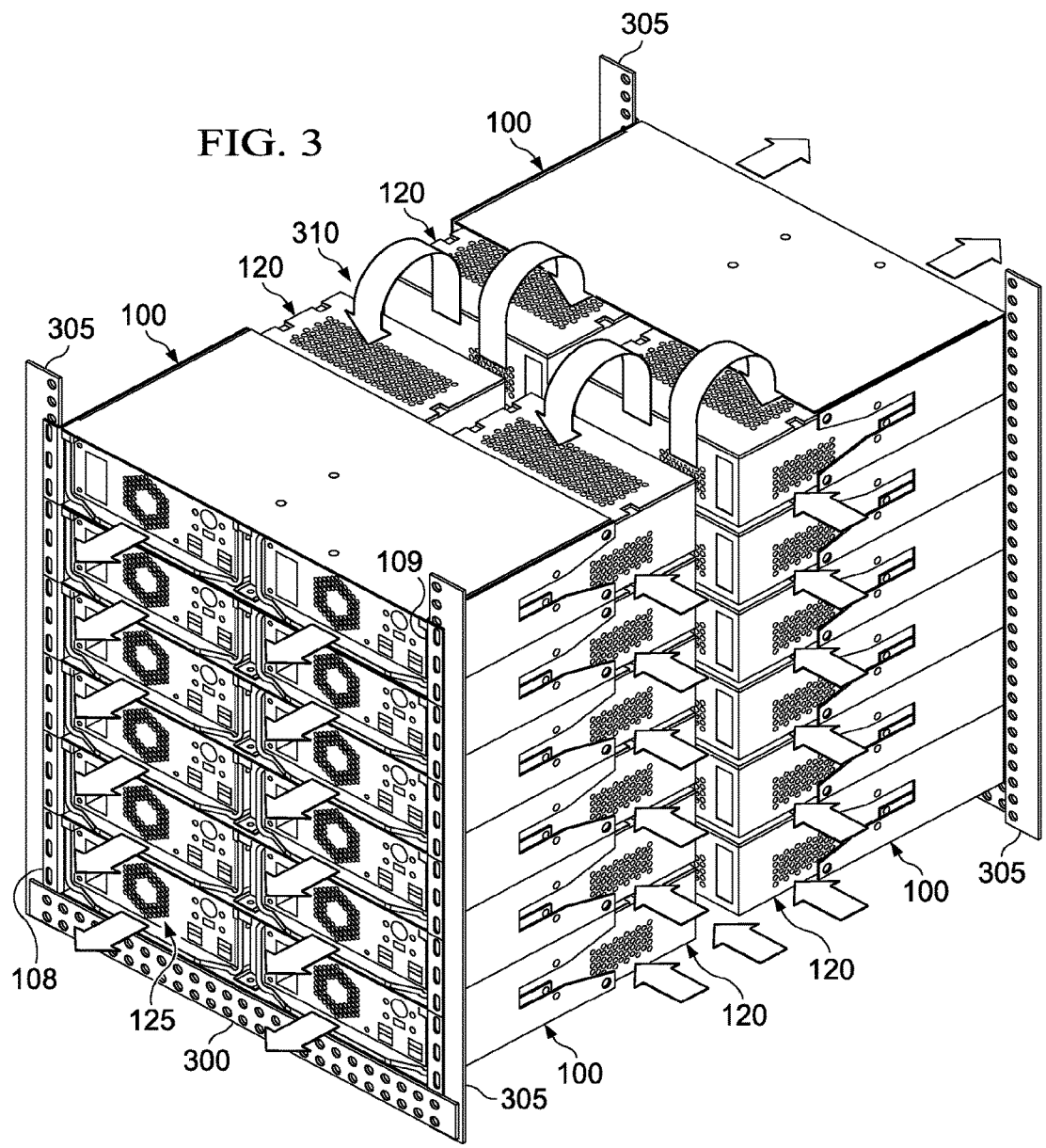

COMPUTER STORAGE ARRAY

CROSS REFERENCE TO RELATED APPLICATIONS

This application is a continuation of U.S. application Ser. No. 14/256,922 filed on Apr. 19, 2014, which is a continuation of U.S. application Ser. No. 14/040,327 filed Sep. 27, 2013, which is a continuation of U.S. application Ser. No. 13/593,509 filed Aug. 24, 2012, which is a continuation of U.S. application Ser. No. 12/770,934, filed Apr. 30, 2010, the disclosures of which are fully incorporated herein by reference for all purposes.

TECHNICAL FIELD

This application is directed, in general, to a network of personal computers and, more specifically, to a modular, centralized, high density, personal computer system with remote operation.

BACKGROUND INFORMATION

Presently, most office environments are served by a computer system comprising a central server coupled to a local area network (LAN) and often also to a wide area network (WAN) and the Internet. Coupled to the LAN is a plurality of personal computers distributed throughout individual offices of the company. This provides a central location where the server and the networks can easily be maintained by an information technology (IT) technician. With the personal computers distributed in individual offices, data that may be required by more than one user must be copied or transferred to the central server or software network provisions made for, usually secure, access to a computer in another part of the company. For example, a large headquarters building of a company, e.g. a bank, may have workers over several floors that need to access individual account data at varying times, e.g., teller, home loan department, vehicle loan department, etc., Additionally, with personal computers distributed throughout spaced-apart offices, the cooling requirements are more distributed, perhaps frequently requiring re-balancing the office air conditioning systems as seasons change. Moreover, individual computer units are relatively large and take up space within the individual's office.

SUMMARY

In response to these and other problems, in one embodiment, there is [Insert the broadest claim]. One aspect, as set forth herein, provides a sub-rack module for supporting a personal computer chassis therein. In this aspect, the sub-rack module comprises an open-ended support module having a top, a bottom, and first and second sides, and a through aperture extending from a front of the open-ended support module to a rear of said open-ended support module. The through aperture has a side-to-side width sufficient to receive a computer chassis therein. The top side of the open-ended support module has a front to rear length such that ventilation apertures of the computer chassis are exposed at the rear when the computer chassis is positioned within the open-ended support module.

In another aspect a system for stacking modular personal computers is provided. This embodiment comprises open-ended support modules each having a top, a bottom, and first and second sides, and a through aperture extending from a front to a rear of the open-ended support modules. The through apertures have a side-to-side width sufficient to receive at least one computer chassis therein. The top side of each open-ended support module has a front to rear length such that ventilation apertures of a computer chassis are exposed at the rear when the at least one computer chassis is positioned within the open-ended support module. This embodiment further includes a multi-position support rack having frame support members coupled together to form a plurality of support locations for the open-ended support modules. The open-ended support modules are located within and supported by the multi-position support rack at least a portion of the support locations.

In a further aspect, a method of manufacturing a system for stacking modular personal computers is provided. This embodiment comprises forming a plurality of open-ended support modules, each having a top, a bottom, and first and second sides, and a through aperture extending from a front of the open-ended support module to a rear of the open-ended support module. The through aperture has a side-to-side width sufficient to receive at least one computer chassis therein. The top side of the open-ended support module has a front to rear length such that ventilation apertures of the computer chassis are exposed at the rear of the open-ended support module when the computer chassis is positioned within the open-ended support module. The method further includes forming a multi-position support rack having frame support members coupled together to form a plurality of support locations for the open-ended support modules, and removably securing at least a portion of the open-ended support modules within the multi-position support rack at one of the support locations.

These and other features, and advantages, will be more clearly understood from the following detailed description taken in conjunction with the accompanying drawings. It is important to note the drawings are not intended to represent the only aspect of the invention.

BRIEF DESCRIPTION OF THE DRAWINGS

FIG. 1A is an isometric view of one embodiment of an open-ended support module constructed according to the principles of the present invention;

FIG. 3 is an isometric view of 12 open-ended support modules with two personal computer chassis inserted in each open-ended support module of a multi-position support rack.

DETAILED DESCRIPTION

Figure 1B:
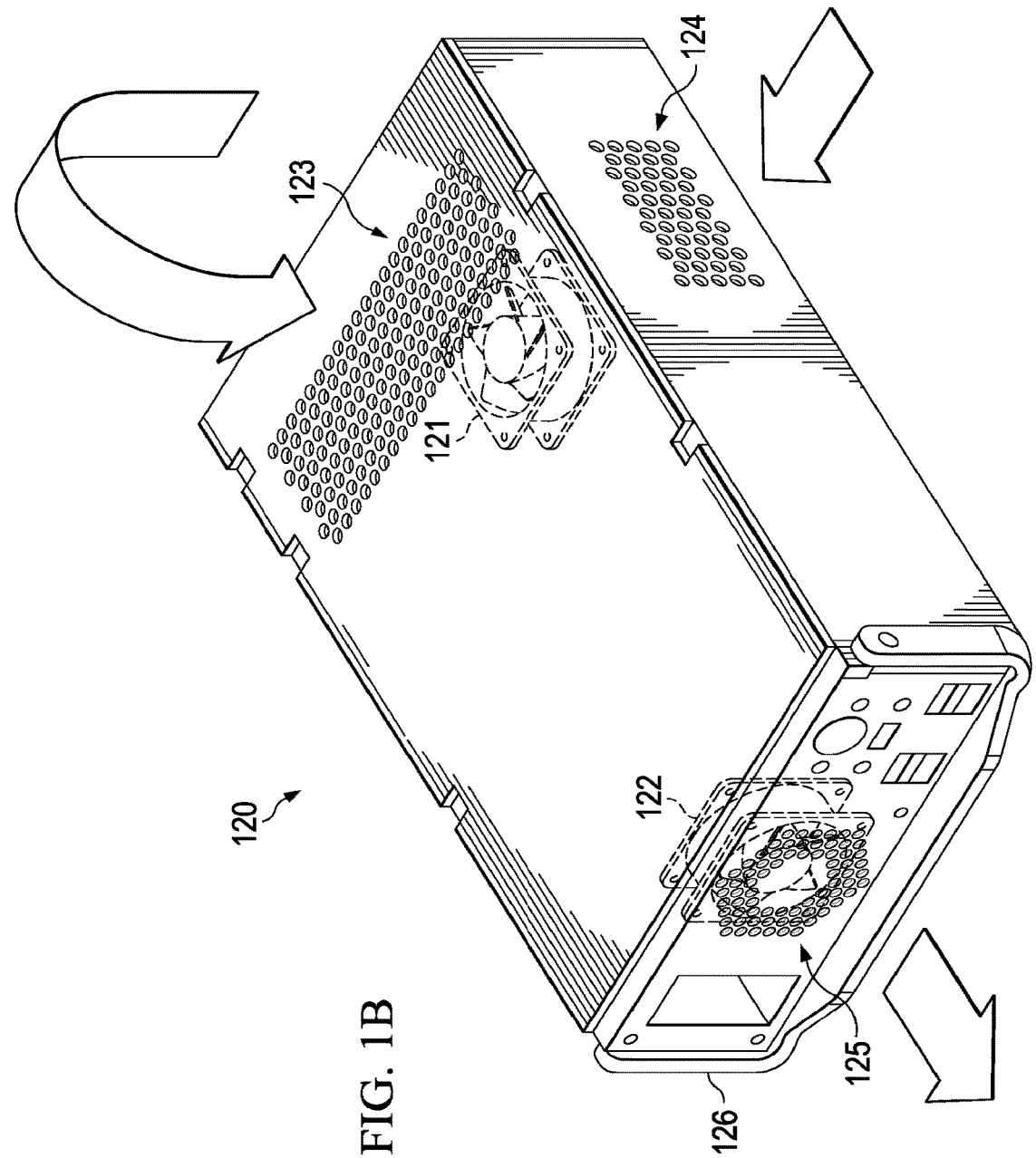
FIG. 1B is an isometric view of one embodiment of a computer chassis constructed according to the principles of the present invention.

For the purposes of promoting an understanding of the principles of the present inventions, reference will now be made to the embodiments, or examples, illustrated in the drawings and specific language will be used to describe the same. It will nevertheless be understood that no limitation of the scope of the invention is thereby intended. Any alterations and further modifications in the described embodiments, and any further applications of the principles of the inventions as described herein are contemplated as would normally occur to one skilled in the art to which the invention relates.

Referring initially to FIG. 1A, illustrated is an isometric view of one embodiment of a sub-rack module 100 constructed according to the principles of the present invention. The sub-rack module 100 comprises an open-ended support module 100 having a top 101, a bottom 102, first and second sides 103, 104, respectively, an optional central divider or partition 107, first and second mounting flanges 108, 109, respectively, and a through aperture 114. The through aperture 114 extends from a front 111 of the open-ended support module 100 to a rear 112 of the open-ended support module 100. In one embodiment, the through aperture 114 has a side-to-side width sufficient to receive at least one computer chassis therein. However, in other embodiments, the through aperture's 114 width is sufficient to provide for two or more computer chassis 120. In one aspect, the through aperture 114 is partitioned into first and second computer chassis sub-bays 105, 106, respectively. The partition 107 may be a panel or a bracket, as shown, and may serve as additional support structure for the open-ended support module 100. The mounting flanges 108, 109 may be configured as shown with which bolts and nuts can be used to removably secure the open-ended support module 100 to a support frame. However, in other embodiments, the mounting flanges 108, 109 may include other means such as friction clamps that can be used to removably secure the open-ended support module 100 to a support frame.

In an alternative embodiment, the open-ended support module 100 may further include notches 113 in the first and second sides 103, 104, respectively, adjacent the rear of the open-end support module 100. As mentioned below, the notches 113 can serve as an opening to facilitate air flow into the back end of the computer chassis 120. When present in certain embodiments, the first and second mounting flanges 108, 109, respectively, extend laterally from the front end 111 on opposing sides of the open-ended support module 100. The open-ended support module 100 may be constructed of any suitable rigid sheet-like material such as sheet metal or hard plastic that is sufficiently strong to support the weight of the open-ended support module 100 or modules.

Referring now to FIG. 1B, illustrated is an isometric view of one embodiment of a computer chassis 120 constructed according to the principles of the present invention. Though the computer chassis 120 is not limited to any particular size, it is particularly advantageous that the computer chassis 120 is compact in size and significantly smaller that typical desk top models; that is the length may typically vary between about 12, 16, and 18 inches, while the overall width may vary between about 6 to 8 inches, and the thickness may be about 3 to 4 inches. The compact size of the computer chassis 120 is particularly advantageous in that the units can be centralized in one location, as opposed to computer chassis being located at multiple stations. The centralization provides greater control over the individual computer chassis, and given that they can be centralized in one location, security can be much improved. However, such centralization and the racking of multiple heat generating computer chassis gives rise to serious cooling considerations, which is what the present disclosure addresses.

In one embodiment, the computer chassis 120 comprises main and secondary cooling fans 121, 122, respectively; and top, side and front ventilation apertures, 123, 124, 125, respectively, and an optional swingable handle 126. The cooling fans 121, 122 and the ventilation apertures 123, 124, and 125 allow for an air flow in a direction that is from the back to the front of the computer chassis 120, and indicated by the large arrows shown in FIG. IB. In this particular embodiment and when used in conjunction with the open-ended support module 100, this air flow allows for efficient cooling when multiple computer chassis 100 are racked together in one central location.

The main and secondary cooling fans 121, 122, respectively, are internal to the computer chassis 120. For clarity, the other components of the personal computer within the computer chassis 120, e.g., hard drive, motherboard, microprocessor, etc., are not shown and may be of conventional design. Ambient cooling air is drawn in through the top and side ventilation apertures 123, 124 by the main cooling fan 121. The air, having been heated by the electronics of the personal computer, is expelled through the front ventilation apertures 125 with the assistance of the secondary cooling fan 122. The optional swingable handle 126 is rotatably coupled to the upper front corners of the computer chassis 120 and may be used to carry, remove, and insert the computer chassis 120 into the first or second through apertures 105, 106, respectively. The mouse and keyboard connect to the computer chassis 120 over Ethernet. The end user can plug in any USB device at the client side and the signal is carried to the computer chassis 120 over Ethernet. The computer within the computer chassis 120 decodes the signal from Ethernet to USB and sees the mouse and keyboard. Power, Ethernet and PCoIP signal as made through the front panel of the computer chassis 120.

Figure 2:
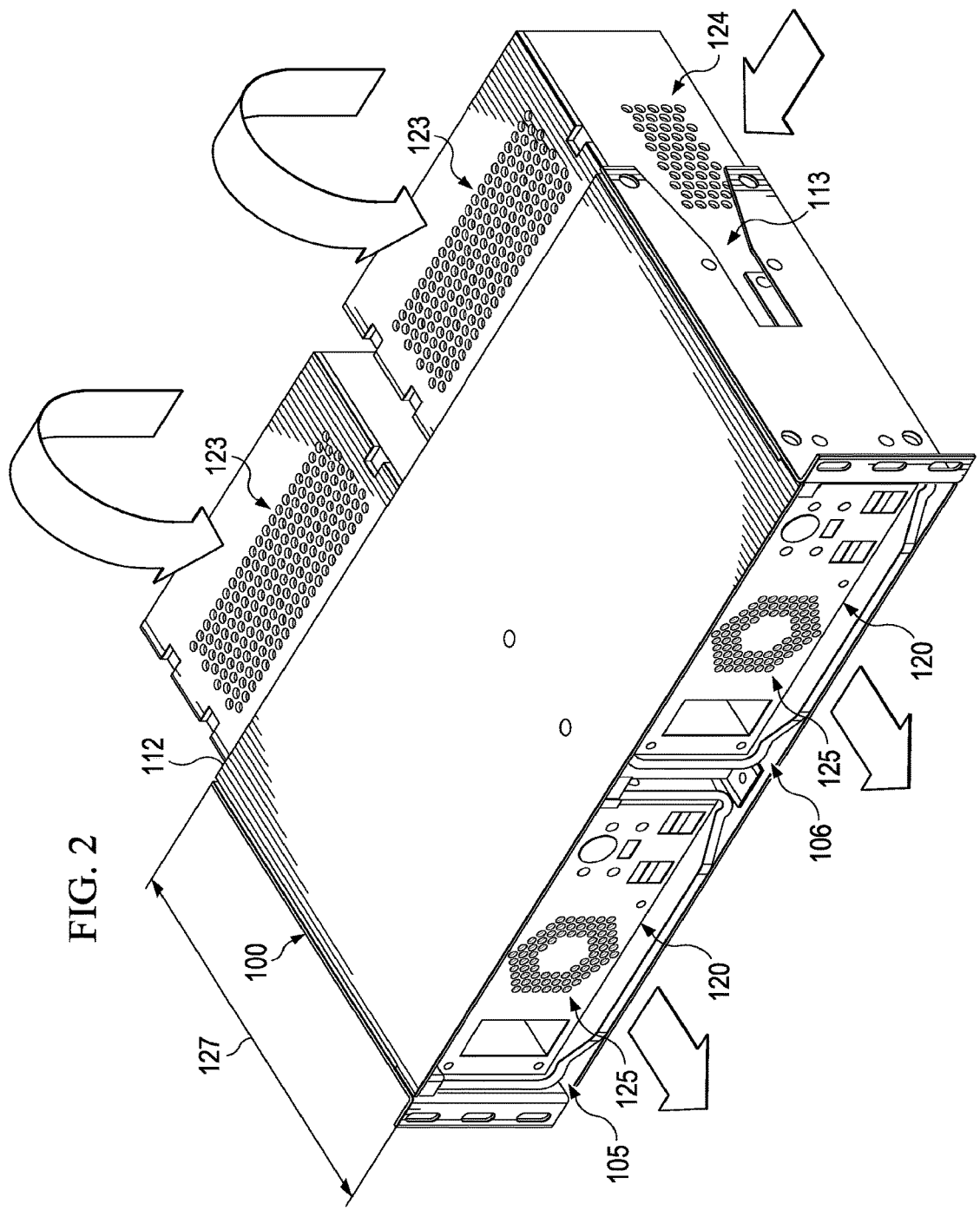
FIG. 2 is an isometric view of the open-ended support module with two personal computer chassis inserted therein.

Referring now to FIG. 2, illustrated is an isometric view of the open-ended support module 100 with two personal computer chassis 120 inserted therein. In this illustrated embodiment, the first and second computer chassis sub-bays 105, 106 are configured to each receive the personal computer chassis 120 therein, and the open-ended support module 100 has a front 111 to rear 112 length 127 such that the top ventilation apertures 123 adjacent the back end of the computer chassis 120 extend beyond the rear 112 of the open-ended support module 100. This cooperative configuration is particularly advantageous in that the air flow from the back to the front of the computer chassis 120 is not blocked or inhibited by any portion of the open-ended support module 100. Optional notches 113 in the first and second sides 102, 103, respectively, permit additional cooling air to enter through the side ventilation apertures 124 when the personal computer chassis 120 is fully inserted into the first and second computer chassis sub-bays 105, 106.

Referring now to FIG. 3, illustrated is one embodiment of an isometric view of 12 open-ended support modules 100 with two personal computer chassis 120 inserted in each open-ended support module 100 of a multi-position support rack 300. The multi-position support rack 300 comprises a plurality of frame support members 305 coupled together to form a plurality of support locations for the open-ended support modules 100. The mounting flanges 108, 109 are configured to cooperate with the frame support members 305 to removably fasten the open-ended support modules 100 at the desired support locations. The top and sides have been removed from the multi-position support rack 300 for better viewing of the contents.

The two stacks of six open-ended support modules 100 with 12 personal computer chassis 120 each are located on opposing sides of the multi-position support rack 300 and are advantageously arranged such that the back ends of the computer chassis 120 oppose each other. This unique configuration forms an air passageway 310 between the rears of the two stacks of personal computer chassis 120 and forms an open air conduit for air to flow from the air passageway 310, through the computer chassis 120 and out the opposing sides of the multi-position support rack 300. More specifically, air flows into the top and optional side ventilation apertures 123, 124, respectively, of each of the personal computer chassis 120 and out the front ventilation apertures 125. This unique configuration allows for efficient cooling of multi-heat generating personal computers, while allowing them to be racked in a single centralized location.

While a multi-position support rack 300 with 24 personal computers is illustrated, one who is of skill in the art will recognize that the multi-position support rack 300 may comprise any number of open-ended support modules 100 arranged so as to position the computer chassis 120 mounted therein with the rear ends of the chassis opposing.

Thus, a stackable modular personal computer array has been described that concentrates the computer hardware in one large, multi-position support rack. Therefore, air conditioning can be provided to accommodate the heat output of the stackable modular personal computer array. With all of the computers commonly located, information can be accessed by any authorized used remotely from the computer array anywhere in the company as well as the information technology technician does not need to walk back and forth from the server room to the office with a computer problem. Furthermore, connecting a keyboard, mouse, etc., can be readily accomplished to a problem computer and diagnosis made. If necessary, the problem computer can be removed from the open-ended support module and replaced with a known good computer.

Those skilled in the art to which this application relates will appreciate that other and further additions, deletions, substitutions and modifications may be made to the described embodiments. For example:

A sub-rack module for supporting a personal computer chassis therein, comprising: an open-ended support module having a top, a bottom, and first and second sides, and a through aperture extending from a front of said open-ended support module to a rear of said open-ended support module, said through aperture having a side-to-side width sufficient to receive a computer chassis therein, said top of said open-ended support module having a front to rear length such that ventilation apertures of said computer chassis are exposed at said rear when said computer chassis is positioned within said open-ended support module.

The sub-rack module above wherein said through aperture has a width configured to receive at least two computer chassis therein.

The sub-rack module above wherein said through aperture is partitioned into at least two computer chassis sub-bays and each of said sub-bays has a width configured to receive a computer chassis therein.

The sub-rack module above further comprising opposing mounting flanges laterally extending from a front end of said open-ended support module, wherein said mounting flanges are configured to enable said open-ended support module to be removably fastened to a supporting frame.

The sub-rack module above wherein said first and second sides of said open-ended support module include notches adjacent said rear formed therein such that side ventilation apertures of a computer chassis are exposed through said notches when said computer chassis is positioned within said open-ended support module to allow air flow through said notches and into said computer chassis.

A system for stacking modular personal computers, comprising: open-ended support modules each having a top, a bottom, and first and second sides, and a through aperture extending from a front to a rear of each of said open-ended support modules, said through apertures having a side-to-side width sufficient to receive at least one computer chassis therein, said top having a front to rear length such that ventilation apertures of a computer chassis are exposed at said rear when said computer chassis is positioned within said open-ended support module; and a multi-position support rack having frame support members coupled together to form a plurality of support locations for said open-ended support modules, and wherein said open-ended support modules are located within and supported by said multi-position support rack at least a portion of said support locations.

The system above further including at least one computer chassis received in at least a portion of said open-ended support modules, said at least one computer chassis having top ventilation apertures located on a top side adjacent a back end thereof, side ventilation apertures located on first and second sides adjacent said back end thereof, and front ventilation apertures located on a front side of said computer chassis.

The system above wherein said frame support members have support locations on opposing sides of said multi-position support rack and wherein said open-ended support modules are positioned vertically and horizontally with respect to each other within said multi-position support rack and are removably secured to said multi-position support rack at said support locations such that said top ventilation apertures of said computer chassis are opposing each other and spaced apart to form an air passageway between opposing back ends of said computer chassis, said computer chassis having at least one fan located therein that directs air through said top ventilation apertures at said back end of said computer chassis and toward and through said front ventilation apertures, such that air is circulated from said passageway and through each of said computer chassis and outward through said front ventilation apertures.

The system above wherein said first and second sides of said open-ended support modules include notches formed therein adjacent said rear such that said side ventilation apertures are exposed through said notches when said at least one computer chassis is positioned within said open-ended support module to allow air flow through said notches and into said computer chassis through said side ventilation apertures.

The system above wherein said computer chassis further includes a rotatable handle attached in said front side of said computer chassis.

The system above wherein each of said open-ended support modules further comprise opposing mounting flanges laterally extending from said front of each of said open-ended support modules, wherein said mounting flanges and said frame support members are configured to enable said open-ended support modules to be removably fastened to said frame support members at said support locations of said multi-position support rack.

A method of manufacturing a system for stacking modular personal computers, comprising: forming a plurality of open-ended support modules, each having a top, a bottom, and first and second sides, and a through aperture extending from a front of said open-ended support module to a rear of said open-ended support module, said through aperture having a side-to-side width sufficient to receive at least one computer chassis therein, said top side of said open-ended support module having a front to rear length such that ventilation apertures of said computer chassis are exposed at said rear of said open-ended support module when said computer chassis is positioned within said open-ended support module; forming a multi-position support rack having frame support members coupled together to form a plurality of support locations for said open-ended support modules; and removably securing at least a portion of said open-ended support modules within said multi-position support rack at one of said support locations.

The method above further comprising placing at least one computer chassis in at least one of said open-ended support modules such that top ventilation apertures located on a top side and adjacent a back end of said computer chassis extend beyond said top side of said open-ended support module.

The method above wherein removably securing one of said open-ended support modules further comprises removably securing said open-ended support modules within said frame support at support locations on opposing sides of said multi-position support rack and wherein said open-ended support modules are positioned vertically and horizontally with respect to each other within said multi-position support rack such that said top ventilation apertures of said computer chassis are opposing each other and spaced apart to form an air passageway between said rear ends of said computer chassis.

The method above wherein forming a plurality of open-ended support modules includes forming open-ended support modules having first and second sides that include notches formed therein adjacent said rear such that side ventilation apertures of said computer chassis are exposed through said notches when said computer chassis is positioned within said open-ended support module to allow air flow through said notches and into said computer chassis through said side ventilation apertures.

The method above wherein forming a plurality of open-ended support modules further comprises forming opposing mounting flanges laterally extending from a front end of said open-ended support module, wherein said mounting flanges are configured to enable said open-ended support modules to be fastened to a supporting frame, and removably securing includes securing said open-ended support modules to said frame support members via said mounting flanges.

The method above wherein forming a plurality of open-ended support modules comprises forming said through aperture with a width configured to receive at least two computer chassis therein.

The method above wherein forming a plurality of open-ended support modules comprises partitioning said through aperture into at least two computer chassis sub-bays and each of said sub-bays has a width configured to receive a computer chassis therein.

The abstract of the disclosure is provided for the sole reason of complying with the rules requiring an abstract, which will allow a searcher to quickly ascertain the subject matter of the technical disclosure of any patent issued from this disclosure. It is submitted with the understanding that it will not be used to interpret or limit the scope or meaning of the claims.

What is claimed is:

1. A computer storage array, comprising;
a first plurality of computer chassis support modules,
a second plurality of computer chassis support modules,
wherein each computer chassis support module of the first plurality of computer chassis support modules and of the second plurality of computer chassis support modules include:
a top wall;
a bottom wall opposing the top wall;
a first side wall coupling the top wall to the bottom wall;
a second side wall coupling the top wall to the bottom wall and opposing the first side wall;
a front aperture defined by a front top wall edge, a front bottom wall edge, a front first side wall edge, and a front second side wall edge;
a rear aperture defined by a rear top wall edge, a rear bottom wall edge, a rear first side wall edge, and a rear second side wall edge;
a first notch defined in the first side wall and the rear first side wall edge;
a second notch defined in the second side wall and the rear second side wall edge;
wherein the rear apertures of the first plurality of computer support modules are positioned to face the rear apertures of the second plurality of computer support modules;
a plurality of computer chassis wherein each computer chassis in the plurality of computer chassis includes a top panel defining a plurality of top ventilation apertures, a bottom panel opposing the top panel, a first side panel defining a plurality of first side ventilation apertures and a second side panel defining a plurality of second side ventilation apertures and the second side panel opposing the first side panel, and a front face defining a plurality of front ventilation apertures,
wherein when each computer chassis of the plurality of computer chassis is inserted into the front aperture of a corresponding computer support module of either the first or second plurality of computer support modules,
the plurality of top ventilation apertures are positioned past the rear top wall edge of the computer support module such that ambient air can flow into the plurality of top ventilation apertures;
the plurality of first side ventilation apertures are positioned adjacent to the first notch such that ambient air can flow into the plurality of the first side ventilation apertures; and
the plurality of second side ventilation apertures are positioned adjacent to the second notch such that ambient air can flow into the plurality of the second side ventilation apertures.

2. The computer storage array of claim 1, wherein each computer support module is sized to accommodate two computer chassis positioned adjacent to each other.

3. The computer storage array of claim 1, further comprising a first frame coupling the first plurality of computer support modules together in a vertical configuration.

4. The computer storage array of claim 3, further comprising a second frame coupling the second plurality of computer support modules together in a second vertical configuration.

* * * * *

UNITED STATES PATENT AND TRADEMARK OFFICE
CERTIFICATE OF CORRECTION

| | | |
|---|---|---|
| PATENT NO. | : 9,615,487 B2 | Page 1 of 1 |
| APPLICATION NO. | : 15/016251 | |
| DATED | : April 4, 2017 | |
| INVENTOR(S) | : Magdy Elwany | |

It is certified that error appears in the above-identified patent and that said Letters Patent is hereby corrected as shown below:

Delete the following sentence in Column 1, beginning at Line 50:
    "In response to these and other problems, in one embodiment, there is [Insert the broadest claim]."

Signed and Sealed this
Eighth Day of August, 2017

Joseph Matal
*Performing the Functions and Duties of the*
*Under Secretary of Commerce for Intellectual Property and*
*Director of the United States Patent and Trademark Office*